US012676617B2

(12) United States Patent
Darwhekar et al.

(10) Patent No.: US 12,676,617 B2
(45) Date of Patent: Jul. 7, 2026

(54) DETERMINISTIC JITTER COMPENSATION SCHEME FOR DTC TIMING PATH

(71) Applicant: TEXAS INSTRUMENTS INCORPORATED, Dallas, TX (US)

(72) Inventors: Yogesh Darwhekar, Bangalore (IN); Abhrarup Barman Roy, Bangalore (IN); Subhashish Mukherjee, Bangalore (IN); Peeyoosh Mirajkar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/956,576

(22) Filed: Sep. 29, 2022

(65) Prior Publication Data

US 2024/0113716 A1 Apr. 4, 2024

(51) Int. Cl.
*H03K 21/08* (2006.01)
*H03K 17/687* (2006.01)

(52) U.S. Cl.
CPC ......... *H03K 21/08* (2013.01); *H03K 17/6871* (2013.01)

(58) Field of Classification Search
CPC ........................... H03K 21/08; H03K 17/6871
See application file for complete search history.

(56) References Cited

U.S. PATENT DOCUMENTS

| | | | | |
|---|---|---|---|---|
| 10,459,468 B1 * | 10/2019 | Ankamreddi | ...... | H03K 17/0822 |
| 2008/0157740 A1 * | 7/2008 | Gurcan | .................... | G05F 1/565 |
| | | | | 323/283 |
| 2016/0147239 A1 * | 5/2016 | Yan | ......................... | G05F 1/575 |
| | | | | 323/280 |
| 2017/0038783 A1 * | 2/2017 | Chen | ......................... | G05F 1/46 |
| 2022/0365489 A1 * | 11/2022 | Darwhekar | ............ | H03K 5/131 |
| 2023/0229184 A1 * | 7/2023 | Lai | ......................... | G05F 1/462 |
| | | | | 323/269 |

FOREIGN PATENT DOCUMENTS

WO    WO-2018101509 A1 *  6/2018  ........... G06K 19/077

* cited by examiner

*Primary Examiner* — Metasebia T Retebo
(74) *Attorney, Agent, or Firm* — Xianghui Huang; Frank D. Cimino

(57) ABSTRACT

In an example, a system includes an N divider coupled to an output of a low dropout regulator. The system also includes a load balancing circuit coupled to the N divider and configured to sink a load balancing current at the output of the low dropout regulator during one or more phases of the N divider. The system includes a switch coupled to the load balancing circuit and configured to connect the load balancing circuit to the output of the low dropout regulator during the one or more phases of the N divider.

20 Claims, 8 Drawing Sheets

400

DETERMINISTIC JITTER COMPENSATION SCHEME FOR DTC TIMING PATH

BACKGROUND

A fractional output divider (FOD) receives a main input clock signal and produces an output clock signal at a programmed frequency. An integer divider can produce an output frequency that is an integer division of the input frequency, such as one-half or one-tenth of the input frequency. An FOD may produce output frequencies other than integer values by dividing the input frequency by a first integer value for a first number of cycles and then dividing the input frequency by a second integer value for a second number of cycles. This process produces an average frequency between the frequencies produced by the two integer values.

SUMMARY

In accordance with at least one example of the description, a system includes an N divider coupled to an output of a low dropout regulator. The system also includes a load balancing circuit coupled to the N divider and configured to sink a load balancing current at the output of the low dropout regulator during one or more phases of the N divider. The system includes a switch coupled to the load balancing circuit and configured to connect the load balancing circuit to the output of the low dropout regulator during the one or more phases of the N divider.

In accordance with at least one example of the description, a system includes an FOD configured to receive an input signal at a first frequency and produce an output signal at a second frequency, where an N divider in the FOD divides the first frequency by an integer N for a first number of cycles and divides the first frequency by N+1 for a second number of cycles. The system also includes a load balancing circuit coupled to the N divider and configured to sink a load balancing current. The system includes a switch coupled to the N divider and the load balancing circuit, where the switch is configured to disconnect the load balancing circuit from the N divider during the first number of cycles and connect the load balancing circuit to the N divider during the second number of cycles.

In accordance with at least one example of the description, a system includes an N divider coupled to an output of a low dropout regulator and a pass transistor. The system includes a sense transistor coupled to the pass transistor and configured to provide a sense current, where the sense current is a mirror of a load current provided by the pass transistor to the N divider. The system includes a test instrument configured to receive the sense current. The system also includes a load balancing circuit coupled to the N divider and the pass transistor, the load balancing circuit configured to sink a load balancing current at the output of the low dropout regulator during one or more phases of the N divider, and where the test instrument is configured to measure the sense current during the one or more phases of the N divider.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
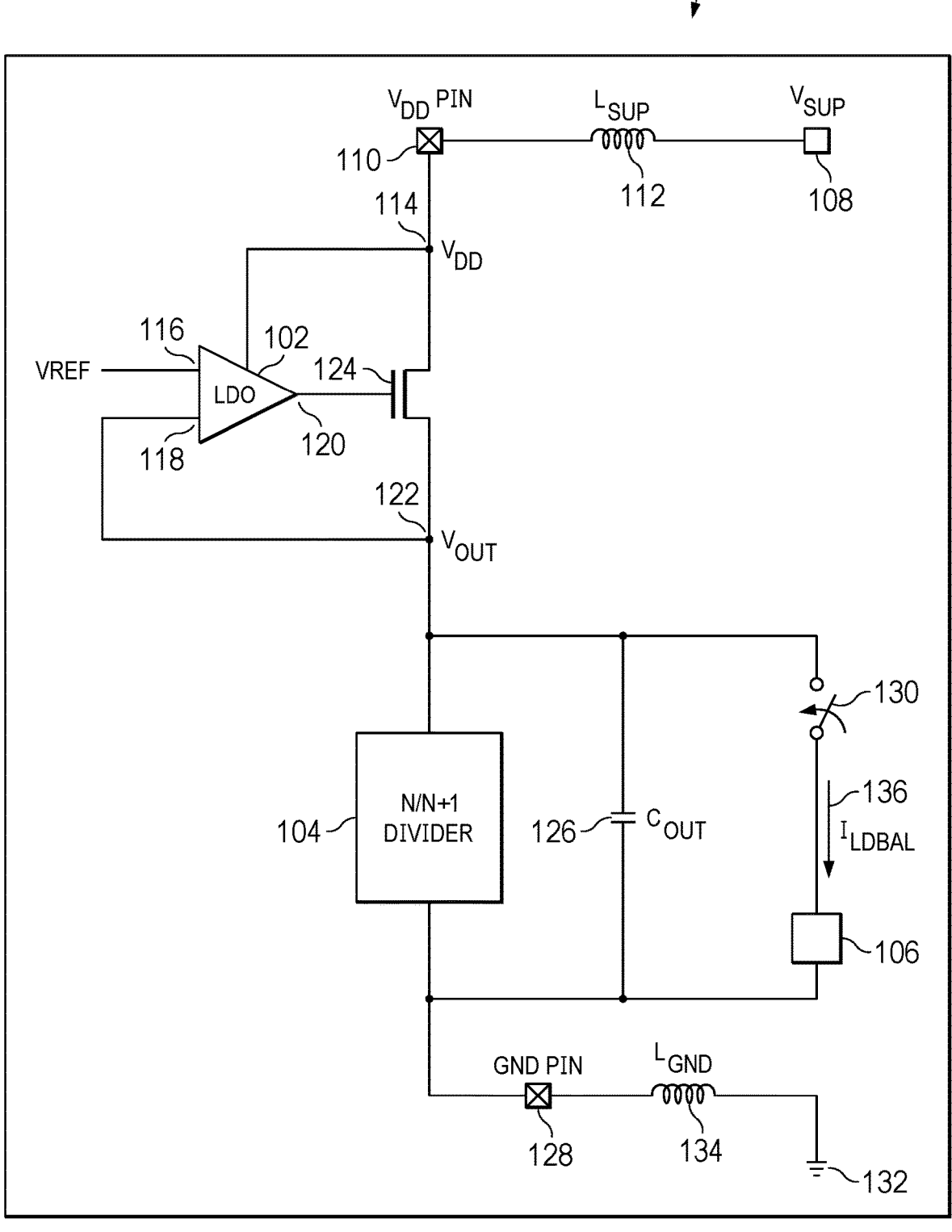
FIG. 1 is a circuit schematic diagram of a system for jitter compensation in accordance with various examples.

An FOD may produce an output clock signal that is a fraction of an input clock signal. The FOD may include a digital to time converter (DTC) which produces a delay in a signal between an input and an output. The amount of delay is modulated by a digital control signal. The DTC synthesizes a clock path within the FOD by interpolating between input clock edges. An FOD may have more than one DTC. The complexity and accuracy of a DTC may depend on frequency, the number of interpolated edges, a jitter requirement, etc. Many types of DTC architectures are possible. The DTC performance may be limited by component mismatch, process/voltage/temperature (PVT) variations, etc. Calibration may be useful for achieving a desired performance.

An FOD produces a non-integer (e.g., fractional) output frequency by dividing an input clock signal by a number (e.g., an integer) N for a first number of cycles, and then dividing by N+1 for a second number of cycles. For example, if N is 10, the FOD produces a 100 megahertz (MHz) output signal from a 1 gigahertz (GHz) input signal. To produce an output signal slightly below 100 MHz, such as 99 MHz, the FOD would modulate the division value N by dividing by N for a first number of cycles and then dividing by N+1 for a second number of cycles. The relative number of times the clock is divided by N, compared to the number of times that it is divided by N+1, determines the average frequency of the output signal. The instantaneous frequency error is corrected by the DTC, which operates on the N divider output.

The modulation of the division value (N) may produce a voltage ripple in the FOD because the settling time of N+1 cycles is slightly longer than the settling time for N cycles. That is, an increasing output voltage $V_{OUT}$ of the FOD has a longer time to increase during N+1 cycles than during N cycles, so the output voltage $V_{OUT}$ reaches a higher value during the N+1 phase than during the N phase. This voltage ripple produces an additional deterministic jitter at the N counter output which is not corrected by the DTC.

In examples herein, the deterministic jitter may be reduced with a load balancing scheme. The timing and information of the N+1 phase is known a priori. A load balancing current is drawn from the FOD supply voltage during the N+1 phase. This additional load balancing current sink compensates for the extra settling time of the N+1 phase and provides equal initial conditions just before the switching edges of the FOD (e.g., switching from N+1 cycles back to N cycles). The magnitude of the load balancing current is programmable and may be chosen based on the value of N and process variations, as described herein. In examples herein, the solution may be implemented without adding a large capacitance as found in some solutions, which reduces area. The examples herein also do not create a current loop that may exit an integrated circuit package via a pin and cause a supply or ground ripple by flowing thru a parasitic element, such as bond wire inductance or resistance.

FIG. 1 is a circuit schematic diagram of a system 100 for jitter compensation in accordance with various examples herein. System 100 includes a low dropout regulator (LDO) 102, an N divider 104, and a load balancer 106. System 100 also includes a voltage supply $V_{SUP}$ 108 coupled to a $V_{DD}$ pin 110. The $V_{SUP}$ 108 may include an inductance $L_{SUP}$ 112 (shown as separate from $V_{SUP}$ 108 in FIG. 1). $V_{DD}$ pin 110 may be coupled to a node 114 that receives a voltage $V_{DD}$. LDO 102 includes a first input 116, a second input 118, and an output 120. First input 116 receives a reference voltage $V_{REF}$. Second input 118 is coupled to node 122. A $V_{OUT}$ voltage is provided at node 122. Output 120 is coupled to a gate of transistor 124. Transistor 124 has a source coupled to node 114 and a drain coupled to node 122. Transistor 124 may be referred to herein as a pass transistor and may be implemented using a field effect transistor (FET), such as an n-channel metal-oxide-silicon FET (nMOSFET) or a p-channel MOSFET.

An output capacitor $C_{OUT}$ 126 is coupled in parallel to N divider 104. Load balancer 106 is coupled between switch 130 and common potential (e.g., ground) pin 128. Switch 130 is coupled between load balancer 106 and node 122. Ground pin 128 is coupled to common potential or ground 132, and the ground pin 128 may include a ground inductance $L_{GND}$ 134. System 100 also includes a load balancing current $I_{LDBAL}$ 136 provided by load balancer 106. System 100 may be an FOD in some examples. In some examples, an FOD may include other components not shown in system 100, as described below. Some components shown in system 100 may be found outside of an FOD in other examples.

Figure 2A:
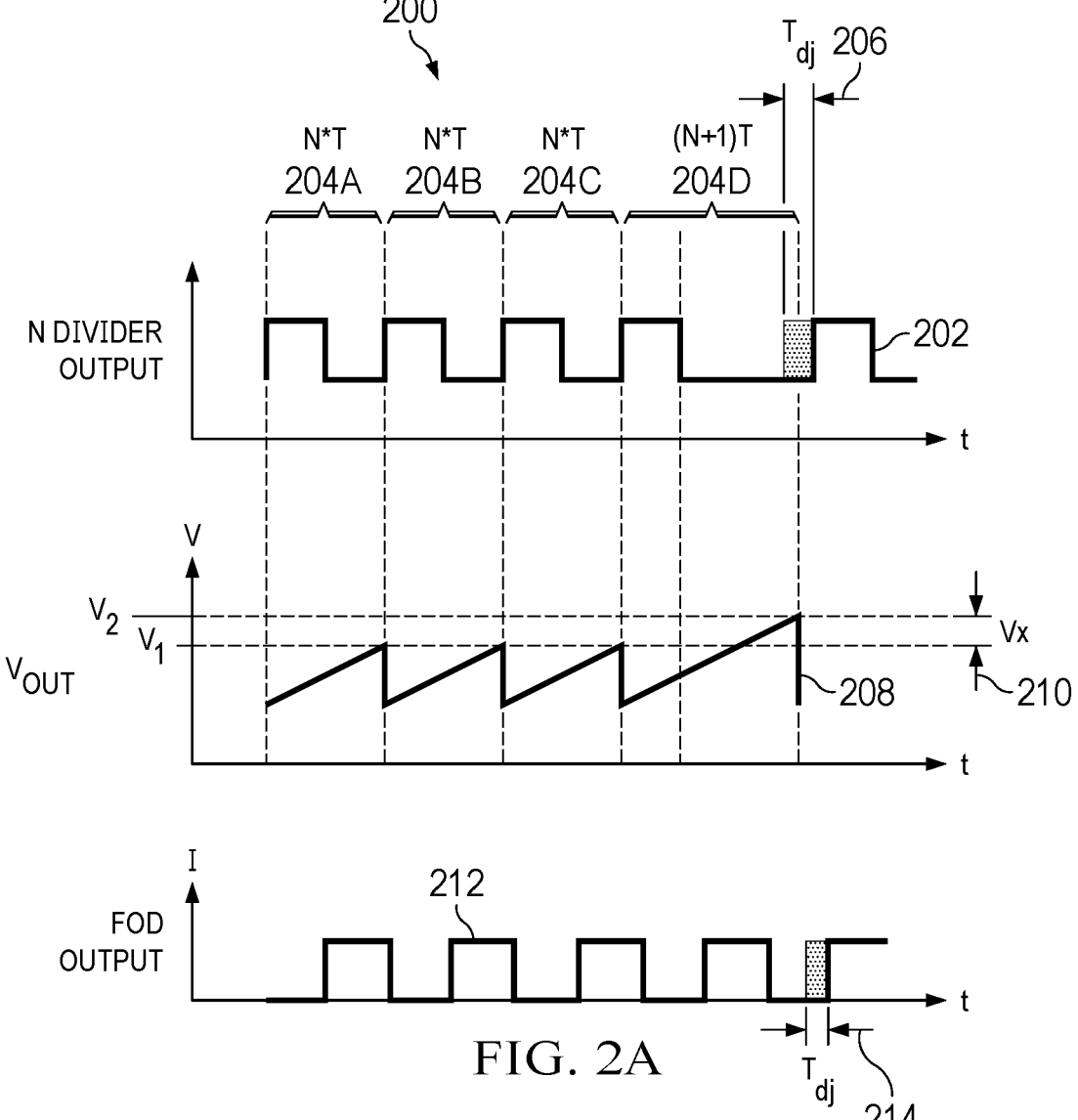
FIGS. 2A and 2B are timing diagrams of FOD phases and voltages in accordance with various examples.
Figure 2B:
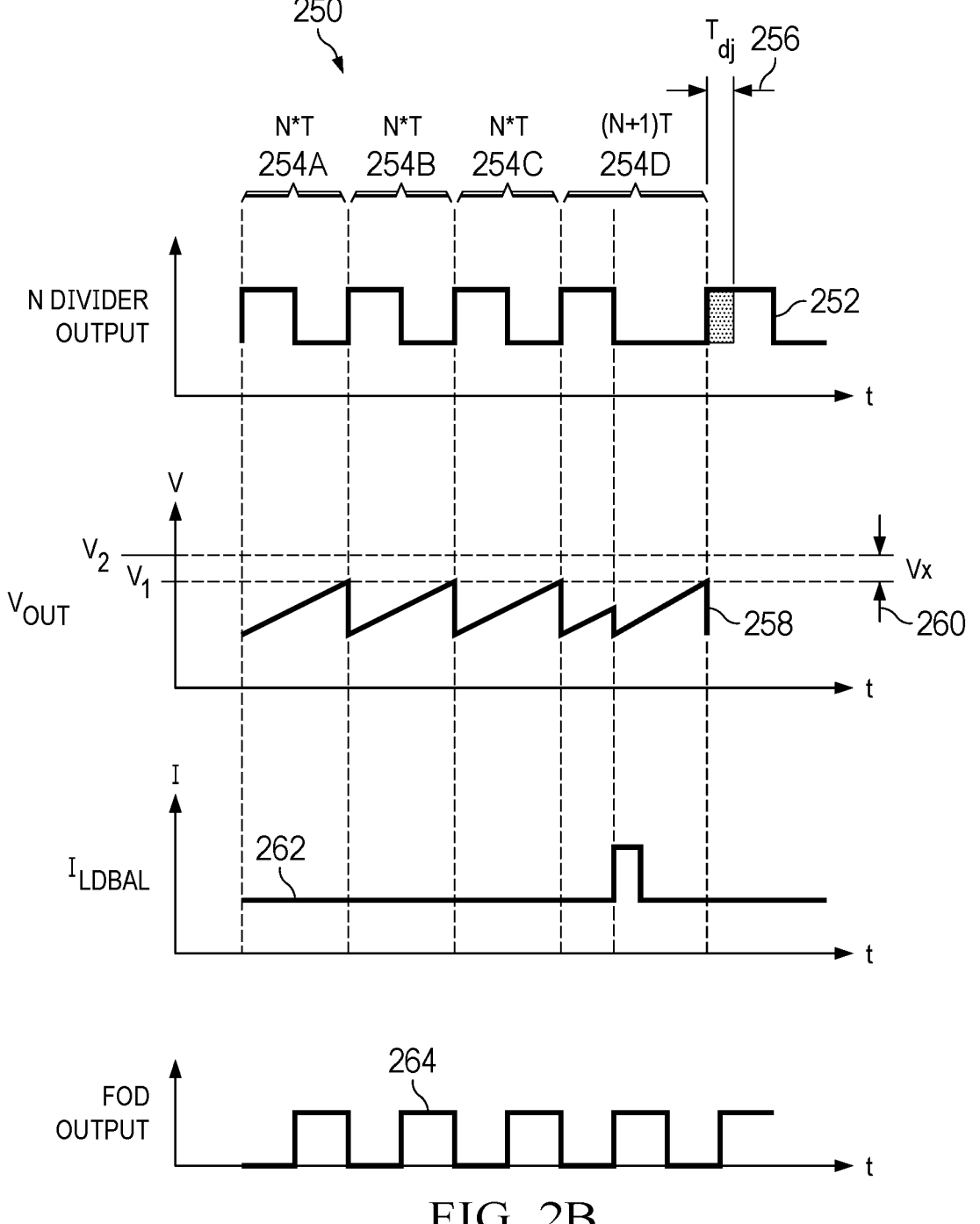

In operation, N divider 104 receives an input clock signal at a first frequency and produces an output clock signal at a second frequency. The second frequency may be an integer or fractional division value of the first frequency. A user may select the programmed output frequency of N divider 104, and N divider 104 produces the programmed output frequency using appropriate values of N and N+1. As described above, N divider 104 divides by N for a first number of cycles and then divides by N+1 for a second number of cycles. Modulation of the input clock signal produces a voltage $V_{OUT}$ at node 114. The average frequency of the output clock signal is provided at node 114. FIGS. 2A and 2B, described below, show the output waveform produced by N divider 104 and the behavior of the voltage $V_{OUT}$ at node 114. As described herein, during the N+1 phases, switch 130 closes and a load balancing current $I_{LDBAL}$ 136 is drawn via load balancer 106. Load balancer 106 is calibrated to provide an amount of current (e.g., $I_{LDBAL}$ 136) during this phase equal to the difference between the average current drawn in the division of N phase versus the average current drawn in the division of N+1 phase. Drawing $I_{LDBAL}$ 136 during the N+1 phase ensures that LDO 102 does not experience a change in current through transistor 124 between the N phases and the N+1 phases. As described below with respect to FIGS. 2A and 2B, $V_{OUT}$ at node 114 has the same value at the end of an N phase as it does at the end of an N+1 phase. Therefore, a ripple in the voltage $V_{OUT}$ at node 114 is removed, which eliminates a deterministic jitter in the output clock signal provided by N divider 104. The value of $I_{LDBAL}$ 136 is programmable for different operating conditions, and the calibration process is also described below. In some examples, LDO 102, transistor 124, N divider 104, output capacitor $C_{OUT}$ 126, switch 130, and load balancer 106 are implemented on a single semiconductor substrate (e.g., a die), and pins 110 and 128 provide electrical connection to external elements (such as $V_{SUP}$ 108 and common potential 132). Inductors 112 and 134 may represent the inductance of bond wires, circuit traces, or other conductors used to connect $V_{DD}$ pin 110 to $V_{SUP}$ 108 and pin 128 to common potential 132, respectively.

FIGS. 2A and 2B are timing diagrams (with time represented on the x-axis) of N divider phases, FOD output, currents, and voltages in accordance with various examples herein. FIG. 2A includes timing diagrams 200 that show N divider phases, $V_{OUT}$, and FOD output without a load balancing circuit. FIG. 2B includes timing diagrams 250 that show N divider phases, $V_{OUT}$, $I_{LDBAL}$, and FOD output with a load balancing circuit in accordance with various examples herein.

Waveform 202 in FIG. 2A shows the N divider output in various phases. The x-axis for waveform 202 is time, while the y-axis is the output of N divider 104. Timing diagrams 200 show four N divider phases 204A, 204B, 204C, and 204D. During phases 204A, 204B, and 204C, the N divider 104 has a value N. During phase 204D, N divider 104 has a value N+1. In this example, the division value from N divider 104 is N for three phases and N+1 for one phase. As shown in waveform 202, the N+1 phase 204D is longer than each of the N phases, and the extra length of phase 204D may produce a deterministic jitter $T_{dj}$ 206.

Waveform 208 in FIG. 2A shows the voltage $V_{OUT}$ at node 122 in one example without a load balancing current ($I_{LDBAL}$). The x-axis for waveform 208 is time, and the y-axis is voltage. During phases 204A, 204B, and 204C, $V_{OUT}$ steadily climbs and reaches a first voltage value V1, and then drops when the next phase of N divider 104 begins, producing a stairstep pattern for waveform 208. Phase 204D is longer than the other phases, so $V_{OUT}$ climbs to a second voltage value V2 by the end of phase 204D. The voltage difference V2–V1 is shown as Vx 210 in FIG. 2A. Vx 210 is a voltage ripple present during each N+1 phase, such as phase 204D. Vx 210 causes the cycle-to-cycle deterministic jitter $T_{dj}$ 206.

Waveform 212 shows the FOD output in various phases. The x-axis for waveform 212 is time, while the y-axis is the output of the FOD. The FOD output shows that a deterministic jitter $T_{dj}$ 214 appears due to the N+1 phase 204D.

FIG. 2B includes timing diagrams 250 that show N divider phases, FOD output, and $V_{OUT}$ with a load balancing circuit in accordance with various examples herein. In FIG. 2B, Vx 260 and deterministic jitter $T_{dj}$ 256 are reduced or eliminated by applying a load balancing current ($I_{LDBAL}$) as described above. The x-axis for waveform 252 is time, while the y-axis is the output of N divider 104. Timing diagrams 250 show four N divider phases 254A, 254B, 254C, and 254D. During phases 254A, 254B, and 254C, the N divider 104 has a value N. During phase 254D, N divider 104 has a value N+1. In this example, the division value from N divider 104 is N for three phases and N+1 for one phase. As shown in waveform 252, the N+1 phase 254D is longer than each of the N phases.

Waveform 258 in FIG. 2B shows the voltage $V_{OUT}$ at node 122 in one example with a load balancing current from load balancer 106. The x-axis for waveform 258 is time, and the y-axis is voltage. During phases 254A, 254B, and 254C, $V_{OUT}$ steadily climbs and reaches a first voltage value V1, and then drops when the next phase of N divider 104 begins, producing a stairstep pattern for waveform 258.

Waveform 262 in FIG. 2B shows the current $I_{LDBAL}$ 136 in one example. The x-axis for waveform 262 is time, and the y-axis is current. During phases 254A, 254B, and 254C (e.g., the N phases) load balancing current $I_{LDBAL}$ 136 is not needed, and is shown as a value of zero. During the N+1 phase (phase 254D), switch 130 closes and load balancer 106 sinks current from node 122. Sinking current from node 122 during phase 254D causes a drop in $V_{OUT}$, shown as a jog in waveform 258 during phase 254D. This jog causes waveform 258 to only reach V1 at the end of phase 254D rather than V2. Therefore, Vx 260 drops to zero, and the value of $V_{OUT}$ at the end of each phase 254 is similar, for both the N phase and the N+1 phases. The deterministic jitter $T_{dj}$ 256 is therefore eliminated with the load balancer 106.

Waveform 264 shows the FOD output in various phases. The x-axis for waveform 264 is time, while the y-axis is the output of the FOD. The FOD output shows that the deterministic jitter $T_{dj}$ 214 from waveform 212 is eliminated with the load balancer 106. Waveform 264 shows no deterministic jitter $T_{dj}$ in this example. In some examples, load balancer 106 causes the value of Vx (FIG. 2A) to be less than 50 μV (for example) thereby causing deterministic jitter $T_{dj}$ to be greatly reduced (or, possibly, approximately equal to zero).

With a load balancer 106, LDO 102 and node 122 do not see a change in the average current during the different phases. Load balancer 106 ensures that the same amount of current is drawn during the N+1 phases as during the N phases. The load balancer 106 causes the jog in $V_{OUT}$ shown in waveform 258 (show in the $V_{OUT}$ timing diagram), but at the end of the N+1 phase, $V_{OUT}$ reaches V1 rather than V2 and the ripple voltage Vx 260 is reduced or eliminated.

The value of load balancing current $I_{LDBAL}$ 136 provided by load balancer 106 may be calibrated and programmable in one example. The value of load balancing current $I_{LDBAL}$ 136, in an example, may vary based on process, component mismatch, temperature, and/or the value of N. Any suitable circuitry may be implemented to produce load balancing current $I_{LDBAL}$ 136. In one example, components inside N divider 104 that produce a current may be replicated with scaled copies within load balancer 106. Replicating these components helps to control for process variations. A switch network within load balancer 106 may switch in the appropriate scaled copies to produce load balancing current $I_{LDBAL}$ 136. During operation, a digital controller may select the appropriate scaled copies (via the switch network) within load balancer 106 based on temperature and the value of N. If the appropriate scaled copies are selected, load balancer 106 provides the correct load balancing current $I_{LDBAL}$ 136 to provide jitter compensation.

Figure 3:
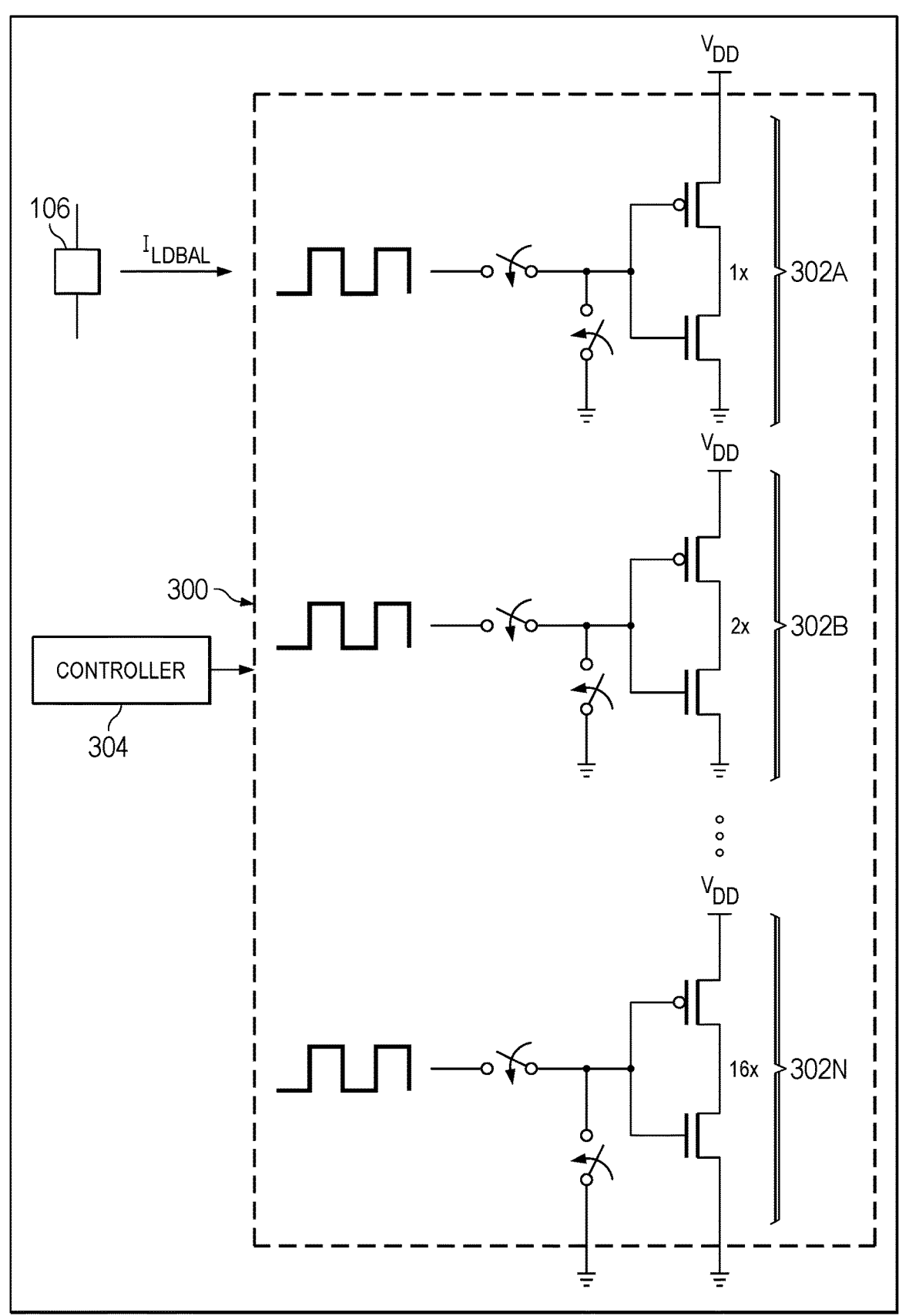
FIG. 3 is a circuit schematic diagram of a system for load balancing in accordance with various examples.

FIG. 3 is a circuit schematic diagram of a system 300 for load balancing in accordance with various examples herein. System 300 is an example of scaled circuitry within load balancer 106. The circuitry includes inverters 302A, 302B, . . . 302N (collectively, inverters 302), which have binary ratios in this example (1x, 2x, . . . 16x). FIG. 3 also includes a digital controller 304. Switches coupled to each inverter 302 may be switched by digital controller 304 to select the appropriate inverters 302 to produce a desired load balancing current $I_{LDBAL}$ 136, based on the temperature, the value of N, etc. In one example, a temperature sensor measures an operating temperature and that temperature is useful for selecting the inverters 302. Calibration may be performed at different temperatures, and interpolation may be useful for selecting the appropriate inverters 302. The digital controller 304 also uses the value of N to select the appropriate inverters 302 during the N+1 phases.

Figure 4:
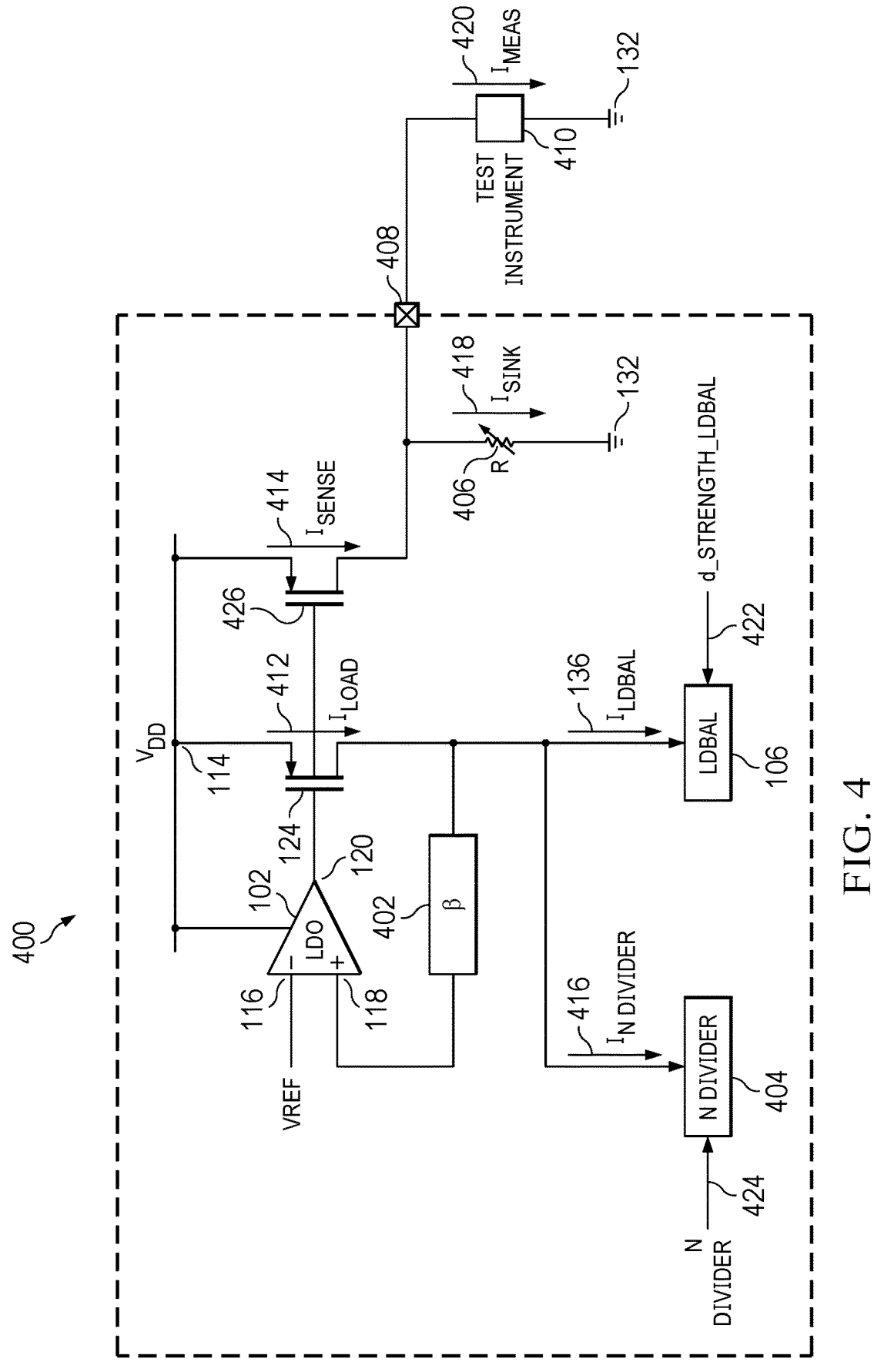
FIG. 4 is a circuit schematic diagram of a system for testing and calibration of a load balancer in accordance with various examples.

FIG. 4 is a circuit schematic diagram of a system 400 for testing and calibration of a load balancer in accordance with various examples herein. Some of the components in FIG. 4 are described above with respect to FIG. 1, and like numerals denote like components. System 400 includes LDO 102, load balancer 106, feedback block 402, N divider 404, resistor 406, sense pin 408, and test instrument 410. A number of currents are shown in system 400, including $I_{LDBAL}$ 136, $I_{LOAD}$ 412, $I_{SENSE}$ 414, $I_{NDIVIDER}$ 416, Ism 418, and $I_{MEAS}$ 420. System 400 also includes d_STRENGTH_LDBAL 422, which is a control bit or bits for selecting scaled copies of circuitry found within load balancer 106, as described above with respect to FIG. 3. System 400 includes $N_{DIV}$ 424, which is the value of N for the N divider 404. System 400 also includes transistor 426, which is a sense transistor coupled to transistor 124 that produces the sense current $I_{SENSE}$ 414, which is a scaled version of $I_{LOAD}$ 412.

In this example, N divider 404 divides an input clock signal by N. The control bits d_STRENGTH_LDBAL select the circuitry within load balancer 106. Sweeping values of these control bits will sweep the magnitude of $I_{LDBAL}$ 136 for testing and calibration.

To begin a testing process, load balancer 106 is initially turned off. N divider 404 operates with a value of N. LDO 102 and transistor 124 produce a current $I_{LOAD}$ 412. Because load balancer 106 is off, $I_{LDBAL}$ 136 is zero. Therefore, $I_{LOAD}$ 412 is equal to $I_{NDIVIDER}$ 416. The value of $I_{NDIVIDER}$ 416 at this time is referred to as I1.

Sense transistor 426 mirrors $I_{LOAD}$ 412 and provides $I_{SENSE}$ 414 to a sense pin 408. Test instrument 410 may measure the current $I_{MEAS}$ 420 that flows through sense pin 408 to determine the amount of current being drawn by N divider 404 while load balancer 106 is off (e.g., I1). As an example, test instrument 410 may be any suitable current sensor that measures current. In another example, test instrument 401 may be any controller, processor, circuitry, sensor, or other hardware that performs the functions described herein. Test instrument 410 may include memory and any software, executable instructions, or digital or analog logic programmed to perform the operations described herein, such as measuring current, determining a difference between two currents, storing data, etc.

When the division changes to N+1 by N divider 404, a different second amount of average current is drawn by N divider 404 ($I_{NDIVIDER}$ 416). This second amount of current is referred to as I2. The load current $I_{LOAD}$ 412 during the N+1 phase is mirrored by sense transistor 426 and provided to sense pin 408. Test instrument 410 measures the difference between the N current and the N+1 current (e.g., I1−I2). Then, load balancer 106 is turned on and the strength of the load balancer 106 is changed via the control bits d_STRENGTH_LDBAL. The value of the control bits d_STRENGTH_LDBAL are changed until the value of the second current (I2) matches the value of the first current (I1). This calibration process determines the strength of the load balancer 106. Calibration may be performed at different temperatures, for different values of N, etc., and the calibration information stored in memory. Then, during operation of the circuit, the stored calibration information may be useful for selecting the magnitude of the load balancing current $I_{LDBAL}$ 136.

In some examples, resistor 406 is a variable resistor. Resistor 406 may be useful for removing a direct current (DC) so the test instrument 410 may more accurately measure the test currents, such as $I_{MEAS}$ 420.

Figure 5:
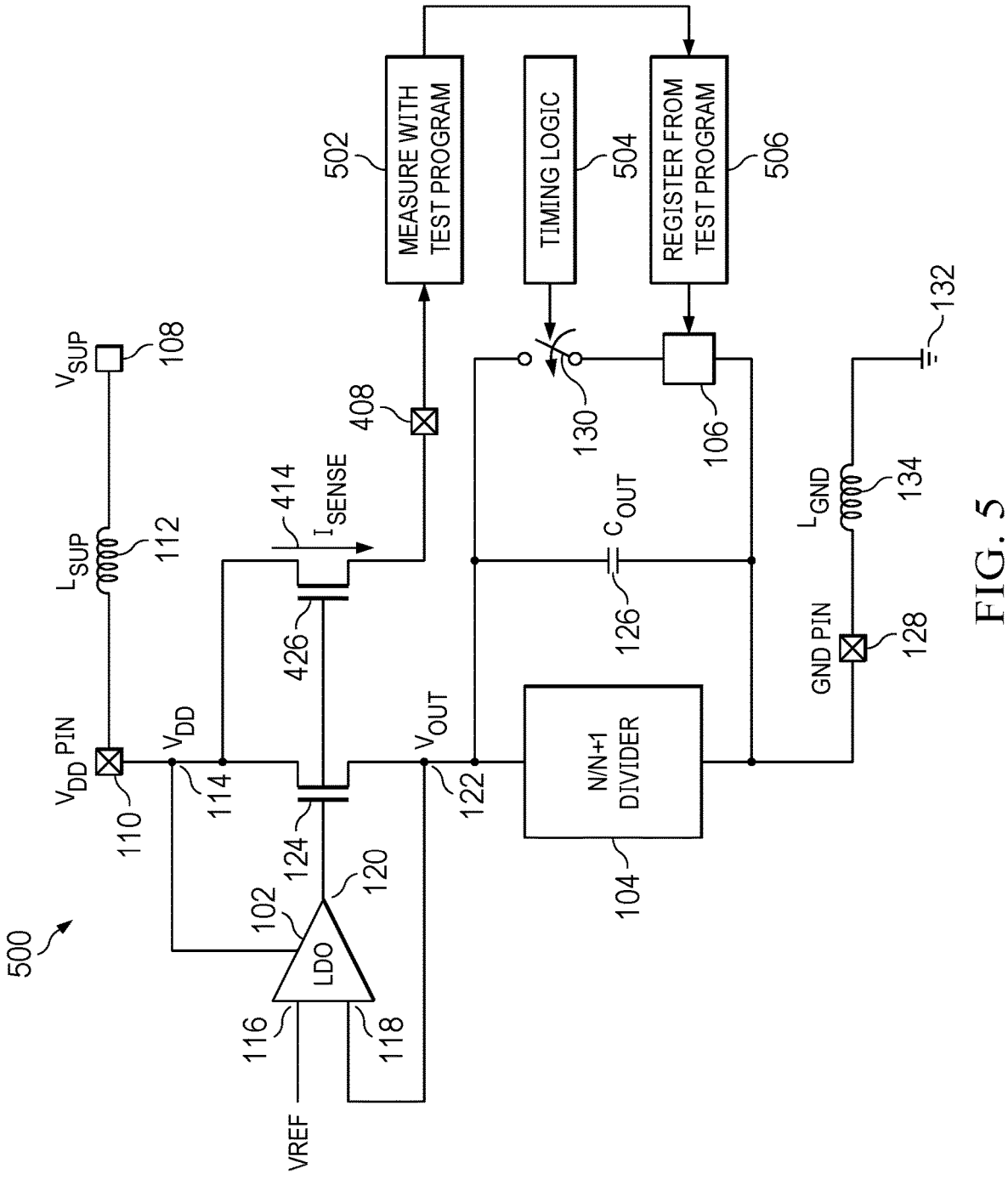
FIG. 5 is a circuit schematic diagram of a system for testing and calibration of a load balancer in accordance with various examples.

FIG. 5 is a circuit schematic diagram of a system 500 for testing and calibration of a load balancer in accordance with various examples herein. Some of the components in FIG. 5 are described above with respect to FIGS. 1 and 4, and like numerals denote like components. System 500 includes a test program 502, timing logic 504, and test program 506.

In an example, a calibration is performed in a testing process by a manufacturer. The testing process is performed at three different temperatures, which may include room temperature and two extreme temperatures. The calibration values for load balancer 106 are stored in on-chip memory. A temperature sensor on the chip determines an operating temperature and loads the appropriate setting for the load balance block from test program 506. The timing for turning on load balancer 106 depends on the N division ratio, which is controlled by a digital controller, such as digital controller 304 (not shown in FIG. 5). The digital controller 304 may use timing logic 504 for determining the value of N and when to switch between N and N+1. Digital controller 304 may also include the calibration information for the strength of load balancer 106. By combining the timing logic and the load balancer 106 calibration information, the digital controller 304 controls switch 130 and load balancer 106 to reduce or eliminate deterministic jitter present at node 122 ($V_{OUT}$) as described herein.

Figure 6:
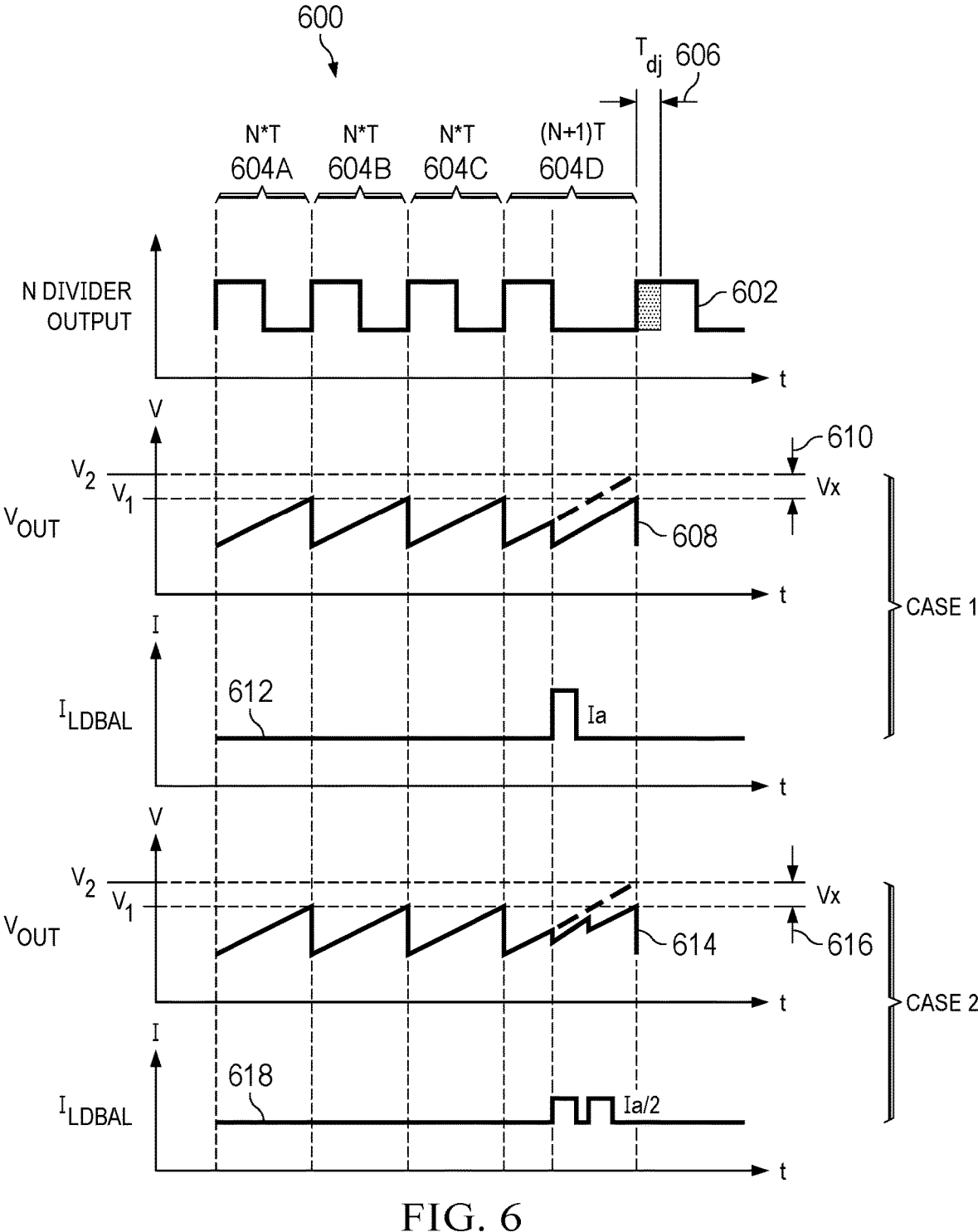
FIG. 6 is a timing diagram of FOD phases, voltages, and currents in accordance with various examples.

FIG. 6 shows timing diagrams 600 of N divider phases, voltages, and currents in accordance with various examples herein. These examples show a variation of the load balancing current $I_{LDBAL}$ 136 in various examples.

Timing diagrams 600 show N divider phases, $V_{OUT}$, and $I_{LDBAL}$ 136 with a load balancing circuit in accordance with various examples herein. In FIG. 6, Vx 610 and 616 and deterministic jitter $T_{dj}$ 606 are reduced or eliminated by applying a load balancing current as described above. The x-axis for waveform 602 is time, while the y-axis is the output of N divider 104. Timing diagrams 600 show four N divider phases 604A, 604B, 604C, and 604D. During phases 604A, 604B, and 604C, the N divider 104 has a value N. During phase 604D, N divider 104 has a value N+1. In this example, the division value from N divider 104 is N for three phases and N+1 for one phase. As shown in waveform 602, the N+1 phase 604D is longer than each of the N phases.

Waveform 608 in FIG. 6 shows the voltage $V_{OUT}$ at node 122 in one example with a load balancing current from load balancer 106. The x-axis for waveform 608 is time, and the y-axis is voltage. During phases 604A, 604B, and 604C, $V_{OUT}$ steadily climbs and reaches a first voltage value V1, and then drops when the next phase of N divider 104 begins, producing a stairstep pattern for waveform 608.

Waveform 612 in FIG. 6 shows the current $I_{LDBAL}$ 136 in one example. The x-axis for waveform 612 is time, and the y-axis is current. During phases 604A, 604B, and 604C (e.g., the N phases) load balancing current $I_{LDBAL}$ 136 is not needed, and is shown as a value of zero. During the N+1 phase (phase 604D), switch 130 closes and load balancer 106 sinks current from node 122. The value of the current is shown as Ia in this example. Sinking current from node 122 during phase 604D causes a drop in $V_{OUT}$, shown as a jog in waveform 608 during phase 604D. This jog causes waveform 608 to only reach V1 at the end of phase 604D rather than V2. Therefore, Vx 610 drops to zero, and the value of $V_{OUT}$ at the end of each phase 604 is similar, for both the N phase and the N+1 phases. The deterministic jitter $T_{dj}$ 606 is therefore eliminated with the load balancer 106.

Waveforms 614 and 618 show a second example. Waveform 614 operates similarly to waveform 608 as described above. In this second example, during the N+1 phase (phase 604D), switch 130 closes and load balancer 106 sinks current from node 122. Waveform 618 shows a load balancing current $I_{LDBAL}$ 136 that is divided into two smaller pieces, each of value Ia/2, rather than one pulse. Multiple pulses of currents may be produced by switching switch 130 multiple times during phase 604D, rather than activating switch 130 one time as shown in waveform 612. In other examples, switch 130 may be switched more than twice during phase 604D.

Figure 7:
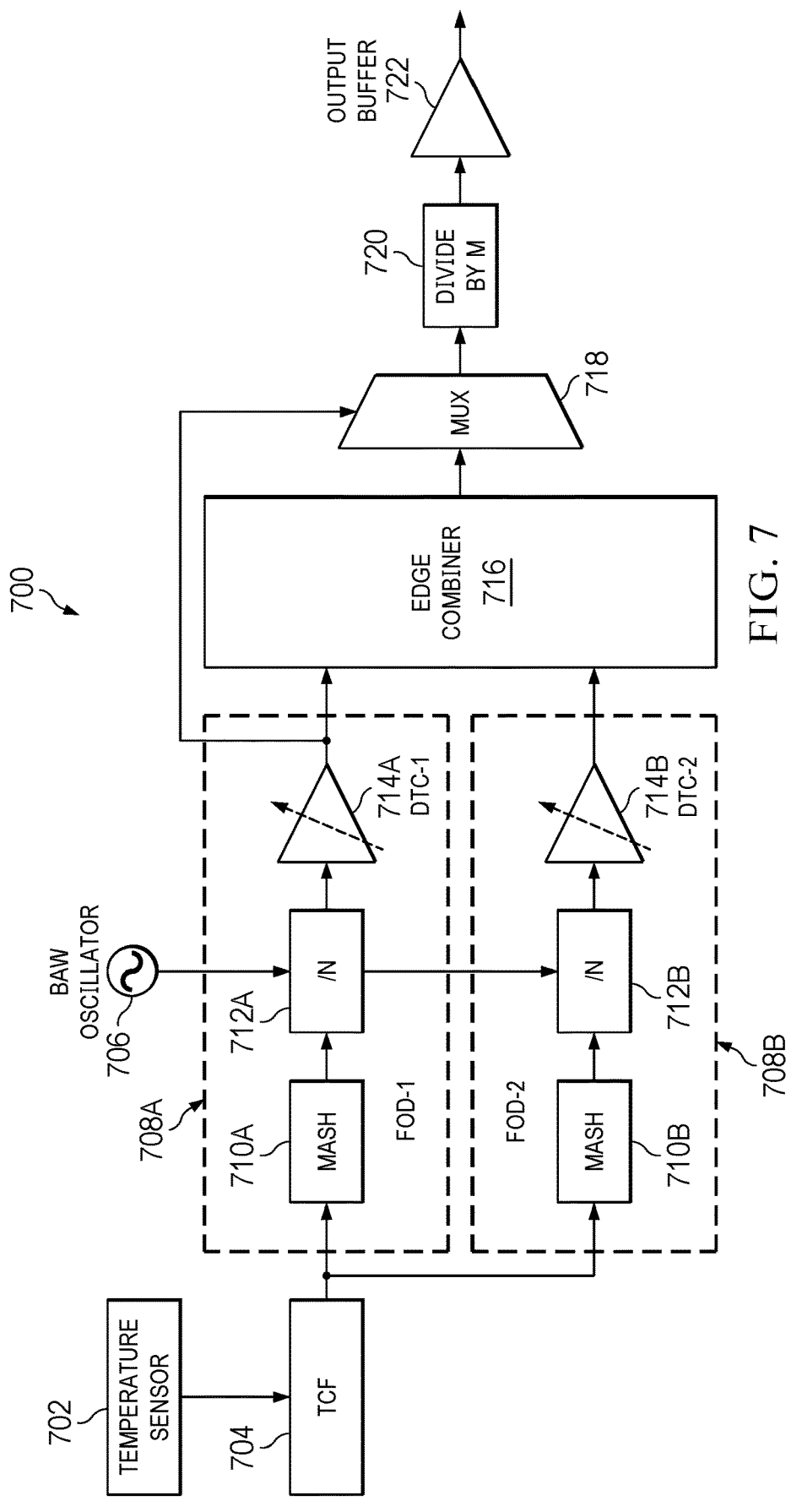
FIG. 7 is a block diagram of a system for jitter compensation in accordance with various examples.

FIG. 7 is a block diagram of a system 700 for jitter compensation in accordance with various examples herein. System 700 is one example system that may include the load balancing circuitry described herein. System 700 includes a temperature sensor 702 and a temperature coefficient of frequency (TCF) module 704. A bulk acoustic wave (BAW) oscillator 706 provides an input frequency signal. In this example, two fractional output dividers (FOD) 708A and 708B are included to create higher frequencies. More than two FODs may be useful in other examples. In some examples, the circuitry described above with respect to FIG. 1 is found in an FOD 708, although not all of the circuit components from FIG. 1 are shown in FIG. 7. The FODs 708 include a multi-stage noise shaping (MASH) delta-sigma modulator 710A and 710B coupled to N dividers 712A and 712B, respectively. The N dividers 712A and 712B may each be an N divider such as N divider 104 described above. The N dividers 712A and 712B may each be coupled to similar circuitry as described above with respect to N divider 104 in FIG. 1, although that circuitry is not shown in FIG. 7. In FIG. 7, each N divider 712 is coupled to a digital to time converter (DTC) 714, shown as DTCs 714A and 714B. The DTCs 714 provide an output signal to edge combiner 716. Edge combiner 716 is coupled to a multiplexer 718. Multiplexer 718 provides an output to a divide by M block 720, which is coupled to an output buffer 722.

In this example, a signal at a first oscillator frequency from BAW oscillator 706 is divided and a signal at a second frequency is provided at output buffer 722, which is a divided value of the oscillator frequency. The division control is performed via MASH 710, which supplies a code for the N dividers 712. As an example, if the frequency is to be divided by 10.5, MASH 710 supplies a code of 10 for a first cycle, then 11 for the second cycle, and then repeats this pattern to produce a result that is divided by 10.5.

In examples herein, deterministic jitter may be reduced with a load balancing scheme. The timing and information of the N+1 phase is known. A load balancing current is drawn from the FOD supply voltage during the N+1 phase. This additional current sink compensates for the extra settling time of the N+1 phase and provides equal initial conditions just before the switching edges of the N divider. The magnitude of the load balancing current is programmable and may be chosen based on the value of N and process variations, as described herein. In examples herein, the solution may be implemented without adding a large capacitance as found in some solutions, which reduces area. The examples described herein may be useful for any timing circuits that have a jitter caused by modulation. For examples, serializers, deserializers, and other timing circuits may include the examples described herein.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOS-FET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter, or, if the value is zero, a reasonable range of values around zero. Modifications are possible in the described examples, and other examples are possible within the scope of the claims.

What is claimed is:
1. A fractional output divider (FOD), comprising:
a transistor having first and second terminals and a control terminal, the first terminal of the transistor coupled to a supply voltage terminal;
a frequency divider circuit having a first terminal coupled to the second terminal of the transistor, and having a second terminal, the frequency divider circuit configured to apply a first frequency divider value to an input signal in a first time period and apply a second frequency divider value to the input signal in a second time period, wherein the first frequency divider value is a first integer, and the second frequency divider value is a second integer and is greater than the first frequency divider value;
a load balancer having a first terminal, and having a second terminal coupled to the second terminal of the frequency divider circuit, the load balancer configured to provide a current;
a switch having a first terminal coupled to the second terminal of the transistor and having a second terminal coupled to the first terminal of the load balancer;
a controller configured to close the switch in the second time period and to open the switch in the first time period; and
a low dropout regulator having an output coupled to the control terminal of the transistor and having an input coupled to the second terminal of the transistor.
2. The FOD of claim 1, wherein the load balancer includes a switch network configured to set a magnitude of the current.
3. The FOD of claim 1, wherein the second frequency divider value is equal to the first frequency divider value plus one.
4. The FOD of claim 1, wherein the load balancer is configured to provide the current in the second time period.
5. The FOD of claim 1, wherein the controller is configured to open the switch throughout the first time period and to close the switch only a portion of the second time period to provide the current from the load balancer as a current pulse.
6. The FOD of claim 1, wherein a magnitude of the current is based at least in part on the first frequency divider value.
7. The FOD of claim 1, wherein a magnitude of the current is based at least in part on a temperature.

8. The FOD of claim 1, wherein the load balancer is configured to provide the current to regulate a voltage at an output of the low dropout regulator.

9. The FOD of claim 1, wherein the FOD includes a digital to time converter (DTC) and a multi-stage noise shaping (MASH) delta-sigma modulator.

10. A system, comprising:

a frequency divider circuit configured to divide a frequency of an input signal by an integer N in a first time period and divide the frequency of the input signal by an integer N+1 in a second time period, the frequency divider circuit having first and second terminals;

a load balancer having a first terminal, and having a second terminal coupled to the second terminal of the frequency divider circuit, the load balancer configured to provide a current;

a switch having a first terminal, and having a second terminal coupled to the first terminal of the load balancer;

a low dropout regulator having an output, having a reference input, and having a second input;

a transistor having a control terminal coupled to the output of the low dropout regulator, having a first terminal coupled to a supply voltage terminal, and having a second terminal coupled to the second input of the low dropout regulator, to the first terminal of the frequency divider circuit, and to the second terminal of the transistor; and a controller configured to close the switch in the second time period and to open the switch in the first time period.

11. The system of claim 10, wherein the load balancer is configured to provide the current to reduce a voltage at the output of the low dropout regulator.

12. The system of claim 10, wherein a magnitude of the current is based at least in part on a value of N.

13. The system of claim 10, wherein a magnitude of the current is based at least in part on a temperature.

14. A system, comprising:

a pass transistor having a control terminal, a first terminal, and a second terminal;

a low dropout regulator having a reference input, a second input, and an output, the second input coupled to the second terminal of the pass transistor, the output coupled to the control terminal of the pass transistor;

a frequency divider circuit having a first terminal coupled to the second terminal of the pass transistor, and having a second terminal, the frequency divider circuit configured to apply a first frequency divider value to an input signal in a first time period and apply a second frequency divider value to the input signal in a second time period, wherein the second frequency divider value is greater than the first frequency divider value;

a sense transistor having a control terminal coupled to the output of the low dropout regulator, having a first terminal coupled to the first terminal of the pass transistor, and having a second terminal coupled to a test terminal;

a switch having a first terminal coupled to the second terminal of the pass transistor, to the second input of the low dropout regulator, and to the first terminal of the frequency divider circuit, and having a second terminal;

a load balancer having a first terminal coupled to the second terminal of the switch, and having a second terminal coupled to the second terminal of the frequency divider circuit, the load balancer configured to provide a current; and a controller configured to open the switch throughout the first time period and to close the switch a portion of the second time period, and configured to set a magnitude of the current during the portion of the second time period.

15. The system of claim 14, wherein the controller is configured to sweep magnitudes of the current to select a first magnitude of current.

16. The system of claim 15, wherein the controller is configured to select the first magnitude of the current so that a current through the pass transistor during the first time period matches a current through the pass transistor during the second time period.

17. The system of claim 16, wherein the load balancer includes a switch network configurable to set the first magnitude of the current responsive to control of the controller.

18. The system of claim 14, wherein the controller is configured to set a magnitude of the current based at least in part on temperature.

19. The system of claim 14, further comprising a test instrument coupled to the test terminal and configured to receive a sense current, wherein the test instrument is configured to measure the sense current during one or more phases of the frequency divider circuit.

20. The system of claim 14, wherein the second frequency divider value is equal to the first frequency divider value plus one.

* * * * *